US012355014B2

United States Patent
Zeng et al.

(10) Patent No.: US 12,355,014 B2
(45) Date of Patent: Jul. 8, 2025

(54) DISPLAY PANEL AND DISPLAY APPARATUS HAVING SUB-PIXELS WITH DIFFERENT APERTURE RATIOS

(71) Applicants: Fuzhou BOE Optoelectronics Technology Co., Ltd., Fujian (CN); BOE Technology Group Co., Ltd., Beijing (CN)

(72) Inventors: Zecun Zeng, Beijing (CN); Tao Fang, Beijing (CN); Wenli Fan, Beijing (CN); Tianfeng Zhang, Beijing (CN); Xin Fang, Beijing (CN); Sang Jin Park, Beijing (CN); Baoqiang Wang, Beijing (CN)

(73) Assignees: Fuzhou BOE Optoelectronics Technology Co., Ltd., Fujian (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/016,846

(22) PCT Filed: Feb. 28, 2022

(86) PCT No.: PCT/CN2022/078387
§ 371 (c)(1),
(2) Date: Jan. 18, 2023

(87) PCT Pub. No.: WO2023/159593
PCT Pub. Date: Aug. 31, 2023

(65) Prior Publication Data
US 2024/0250073 A1    Jul. 25, 2024

(51) Int. Cl.
| | |
|---|---|
| *H01L 25/075* | (2006.01) |
| *G02F 1/1335* | (2006.01) |
| *G02F 1/13357* | (2006.01) |
| *G02F 1/1343* | (2006.01) |
| *H01L 25/065* | (2023.01) |

(52) U.S. Cl.
CPC .... H01L 25/0753 (2013.01); G02F 1/133512 (2013.01); G02F 1/133603 (2013.01);
(Continued)

(58) Field of Classification Search
CPC ............. H01L 25/0753; H01L 25/0652; G02F 1/133512; G02F 1/133603; G02F 1/134336; G02F 1/134345
See application file for complete search history.

(56) References Cited

U.S. PATENT DOCUMENTS

| | | | |
|---|---|---|---|
| 2010/0013853 A1* | 1/2010 | Takatori ................. | H05B 47/16 |
| | | | 345/611 |
| 2016/0275910 A1 | 9/2016 | Lee et al. | |

(Continued)

FOREIGN PATENT DOCUMENTS

| | | |
|---|---|---|
| CN | 106707606 A | 5/2017 |
| CN | 107422517 A | 12/2017 |

(Continued)

OTHER PUBLICATIONS

Luo et al., CN107942564, machine translation Apr. 2018 (Year: 2018).*

*Primary Examiner* — Tracie Y Green
(74) *Attorney, Agent, or Firm* — IPro, PLLC

(57) ABSTRACT

Embodiments of the present disclosure provide a display panel and a display apparatus. The display panel includes: a display region and at least one non-display region adjacent to the display region; a boundary between the at least one non-display region and the display region has a curve part; the display panel includes pixels, including first pixels and second pixels; the pixels include sub-pixels; each first pixel includes: at least one first sub-pixel opening region corresponding to at least one sub-pixel and located in the display region, at least one first sub-pixel opening region in each first pixel is adjacent to the curve part, and a shape of at least (Continued)

part of the at least one first sub-pixel opening region adjacent to the curve part is non-rectangular; and each second pixel is located in the display region, each second pixel includes a second sub-pixel opening region corresponding to a sub-pixel.

15 Claims, 14 Drawing Sheets

(52) U.S. Cl.
CPC .. *G02F 1/134336* (2013.01); *G02F 1/134345* (2021.01); *H01L 25/0652* (2013.01)

(56) References Cited

U.S. PATENT DOCUMENTS

| | | | |
|---|---|---|---|
| 2019/0147803 A1* | 5/2019 | Liu | G09G 3/3233 345/204 |
| 2020/0110302 A1 | 4/2020 | Kuroe et al. | |
| 2020/0219944 A1* | 7/2020 | Yi | H10K 59/88 |
| 2021/0151519 A1 | 5/2021 | Lv et al. | |
| 2021/0364868 A1* | 11/2021 | Zhang | G02F 1/134309 |
| 2022/0216272 A1 | 7/2022 | Zhang | |
| 2023/0009464 A1 | 1/2023 | Xu et al. | |

FOREIGN PATENT DOCUMENTS

| | | |
|---|---|---|
| CN | 107741871 A | 2/2018 |
| CN | 107819020 A | 3/2018 |
| CN | 107942564 A | 4/2018 |
| CN | 108400156 A | 8/2018 |
| CN | 108538895 A | 9/2018 |
| CN | 110689810 A | 1/2020 |
| CN | 111522170 A | 8/2020 |

* cited by examiner

DISPLAY PANEL AND DISPLAY APPARATUS HAVING SUB-PIXELS WITH DIFFERENT APERTURE RATIOS

CROSS-REFERENCE TO RELATED APPLICATIONS

The disclosure is a National Stage of International Application No. PCT/CN2022/078387, filed on Feb. 28, 2022, which is hereby incorporated by reference in their entireties.

FIELD

The present disclosure relates to the technical field of display, in particular to a display panel and a display apparatus.

BACKGROUND

With the rapid development of a display technology, shapes of display products in intelligent terminals are increasingly rich, for example, display products with circular screens or arc screens have been very common. Generally, the display products with arc screens or circular screens are usually applied to smart bracelets or watches and the like, and the display products are small in size and high in resolution. However, with the increasing demand for larger round screens or arc displays in the market, mid-large display screens with larger size and low resolution are becoming more and more popular. The edges of the circular screen or arc screen display region are prone to visible sawtooth and color stripes, which affects the display effect and user experience.

SUMMARY

An embodiment of the present disclosure provides a display panel, including: a display region and at least one non-display region adjacent to the display region, where a boundary between the at least one non-display region and the display region has a curve part. The display panel includes:
  a plurality of pixels, arranged in a first direction and a second direction in an array, and including: a plurality of first pixels and a plurality of second pixels, where each pixel includes a plurality of sub-pixels; the first direction intersects with the second direction; each first pixel includes at least one first sub-pixel opening region corresponding to at least one sub-pixel and located in the display region, the at least one first sub-pixel opening region in each first pixel is adjacent to the curve part, and a shape of at least part of the at least one first sub-pixel opening region adjacent to the curve part is non-rectangular; each second pixel is located in the display region, each second pixel includes a second sub-pixel opening region corresponding to a sub-pixel, and a shape of the second sub-pixel opening region is rectangular; and a ratio of an area of each first sub-pixel opening region to an area of a sub-pixel corresponding to the each first sub-pixel opening region in the display region is less than a ratio of an area of the second sub-pixel opening region to an area of the sub-pixel in the second pixel.

In some embodiments, the curve part includes at least one circular arc.

In some embodiments, colors of two adjacent sub-pixels in the first direction are different, and colors of two adjacent sub-pixels in the second direction are the same;
  a pattern enclosed by the boundary between the non-display region and the display region has a first axis of symmetry parallel to the first direction and a second axis of symmetry parallel to the second direction;
  the at least one circular arc includes a first arc part and a second arc part with equal radians; the first axis of symmetry bisects the first arc part and the second arc part, and the first arc part and the second arc part are symmetrical along the second axis of symmetry; and at least one first sub-pixel opening region in each of the first pixels is adjacent to the first arc part or the second arc part.

In some embodiments, the radian of the first arc part and the radian of the second arc part are both 60°.

In some embodiments, in the display region, colors of any two adjacent sub-pixels are different;
  a pattern enclosed by the boundary between the non-display region and the display region has a first axis of symmetry parallel to the first direction and a second axis of symmetry parallel to the second direction;
  the at least one circular arc includes a third arc part and a fourth arc part with equal radians; the third arc part and the fourth arc part are adjacent to the first axis of symmetry on two sides of the first axis of symmetry respectively, and the third arc part and the fourth arc part are in central symmetry; and
  at least one first sub-pixel opening region in each of the first pixels is adjacent to the third arc part or the fourth arc part.

In some embodiments, the radian of the third arc part and the radian of the fourth arc part are both 30°.

In some embodiments, colors of two adjacent sub-pixels in the first direction are different, and colors of two adjacent sub-pixels in the second direction are the same; the plurality of pixels include: a plurality of pixel rows arranged in the second direction, and each pixel row includes a plurality of pixels arranged in the first direction; and in the display region, in each pixel row, the pixel closest to the circular arc is the first pixel.

In some embodiments, a shape of the display region is circular; the at least one non-display region includes: a first non-display region surrounding the display region; and the curve part includes a circumference corresponding to the boundary between the first non-display region and the display region.

In some embodiments, the display panel includes:
  an array substrate, including: a first base substrate and the sub-pixels located on one side of the first base substrate;
  an opposite substrate, disposed opposite to the array substrate; where the opposite substrate comprises: a second base substrate, and a light shielding layer located on one side, facing the array substrate, of the second base substrate; where the light shielding layer includes: a first light shielding part, a second light shielding part and a plurality of sub-pixel opening regions; an orthographic projection of a region enclosed by the first light shielding part on the second base substrate coincides with the display region, and an orthographic projection of the first light shielding part on the first base substrate covers an orthographic projection of at least part of the first pixels on the first base substrate; the second light shielding part is located between adjacent sub-pixel opening regions; and the plurality of sub-pixel opening regions include: a plurality of first sub-pixel opening regions and a plurality of second sub-pixel opening regions; and a liquid crystal layer, located between the array substrate and the opposite substrate.

In some embodiments, the at least one non-display region includes: a second non-display region enclosed by the display region; and a shape of the second non-display region is circular, and the curve part includes a circumference corresponding to the boundary between the second non-display region and the display region.

In some embodiments, the at least one non-display region includes: a first non-display region surrounding the display region; and a shape of the display region is a rounded rectangle, and the curve part includes: four rounded corner parts of the boundary between the display region and the first non-display region.

In some embodiments, the boundary between the first non-display region and the display region further includes a first straight line part parallel to the second direction, and two ends of the first straight line part are connected with a rounded corner part respectively; a radian of each of the rounded corner parts is less than or equal to 90° and larger than 60°;

each rounded corner part is divided into: a first part and a second part; a radian of the first part is 60°, and the second part is connected with the first straight line part; and at least one first sub-pixel opening region in each of the first pixels is adjacent to the 35 second part.

In some embodiments, a width of each of the plurality of sub-pixels in the first direction is less than a width of each of the plurality of sub-pixels in the second direction.

In some embodiments, the plurality of pixels further include: a plurality of third pixels adjacent to the curve part in a region other than the first pixels;

each third pixel includes at least one third opening region located in the display region, the at least one third opening region in each of the third pixels is adjacent to the curve part, and a shape of at least part of the at least one third opening region adjacent to the curve part is non-rectangular; and a ratio of an area of each third opening region to an area of a sub-pixel corresponding to the each third opening region in the display region is equal to a ratio of an area of the second opening region to an area of the sub-pixel in the second pixel.

In some embodiments, the sub-pixel in each of the first pixels only correspond to one first sub-pixel opening region.

In some embodiments, at least part of sub-pixels in each of the first pixels corresponds to a plurality of first sub-pixel opening regions.

In some embodiments, the plurality of first sub-pixel opening regions are arranged in the first direction and/or the second direction.

In some embodiments, a ratio of an area of each first sub-pixel opening region to the area of the sub-pixel corresponding to the each first sub-pixel opening region in the display region is a first aperture ratio, and the ratio of the area of the second sub-pixel opening region to the area of the sub-pixel in the second pixel is a second aperture ratio; and a ratio of the first aperture ratio to the second aperture ratio is larger than or equal to 16.8% and less than or equal to 31.6%.

An embodiment of the present disclosure provides a display apparatus, including the display panel provided by the embodiments of the present disclosure.

BRIEF DESCRIPTION OF THE DRAWINGS

In order to explain technical solutions in embodiments of the present disclosure more clearly, the following will briefly introduce accompanying drawings needed to be used in the description of the embodiments. Obviously, the accompanying drawings in the following description are only some embodiments of the present disclosure. For those of ordinary skill in the art, other accompanying drawings can be further obtained according to these accompanying drawings without paying creative labor.

DETAILED DESCRIPTION OF THE EMBODIMENTS

Figure 1:
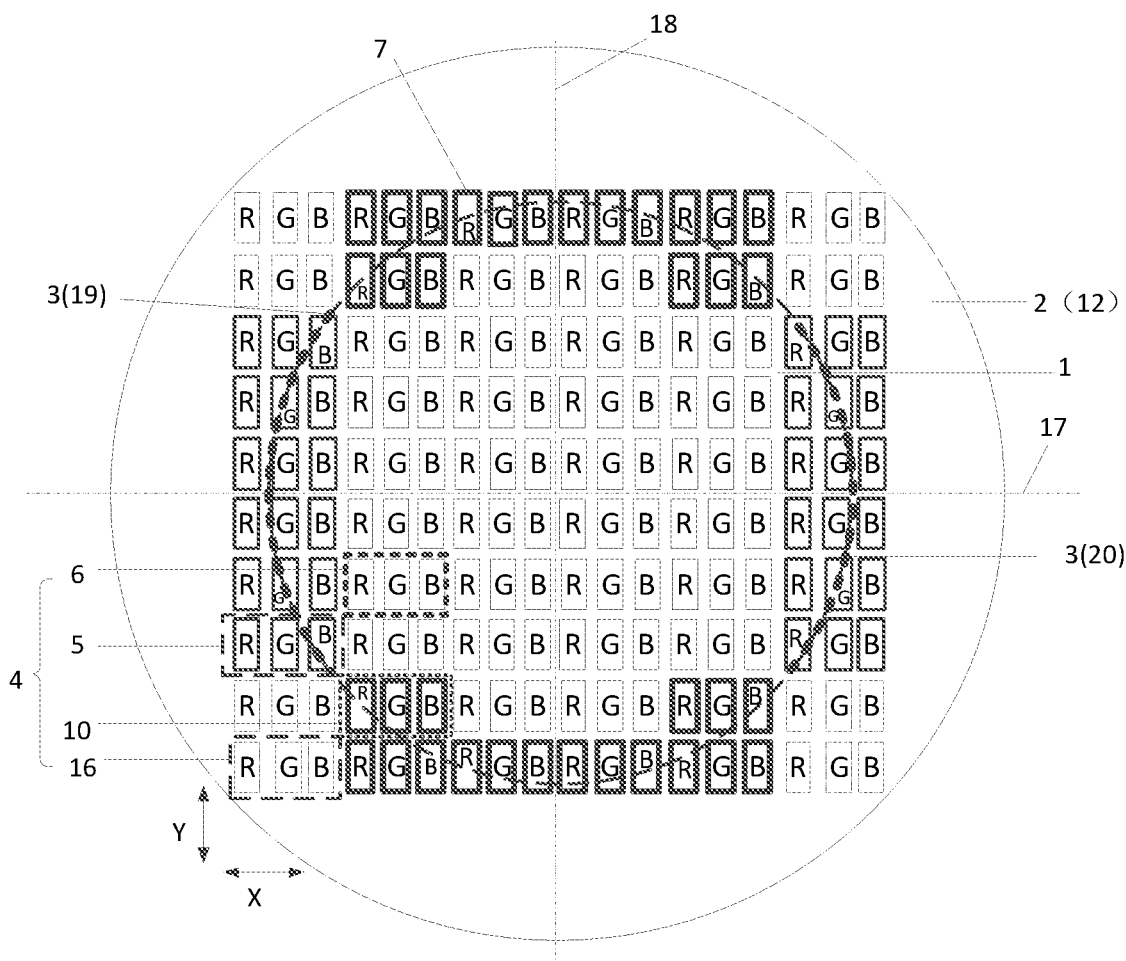
FIG. 1 is a schematic structural diagram of a display panel provided by an embodiment of the present disclosure.

To make objectives, technical solutions and advantages of embodiments of the present disclosure clearer, the technical solutions of the embodiments of the present disclosure will be clearly and completely described below in conjunction with the accompanying drawings of the embodiments of the present disclosure. Apparently, the described embodiments are only a part of the embodiments of the present disclosure, but not all the embodiments. The embodiments in the present disclosure and features in the embodiments can be combined with each other in the case of not conflicting. Based on the described embodiments of the present disclosure, all other embodiments obtained by those ordinarily skilled in the art without creative work shall fall within the protection scope of the present disclosure.

Unless otherwise defined, technical or scientific terms used in the present disclosure shall have the ordinary meanings understood by those ordinarily skilled in the art to which the present disclosure pertains. The words "first", "second" and the similar words used in the present disclosure do not indicate any order, quantity or importance, but are merely used to distinguish different components. The words "comprise" or "include" and the like indicate that an element or item appearing before such the word covers listed elements or items appearing after the word and equivalents thereof, and does not exclude other elements or items. The words "connect" or "couple" or the like are not limited to physical or mechanical connection, but may include electrical connection, whether direct or indirect.

It needs to be noted that the sizes and shapes of all figures in the accompanying drawings do not reflect true scales, and are only intended to schematically illustrate the content of the present disclosure. The same or similar reference numerals represent the same or similar elements or elements with the same or similar functions all the time.

In the related art, when an edge of a display region has an arc or circular part, at least part of sub-pixels may be missing in the arc or circular part, resulting in uneven color mixing in the region, which is prone to visible color stripes, affecting the display effect and user experience.

Figure 2:
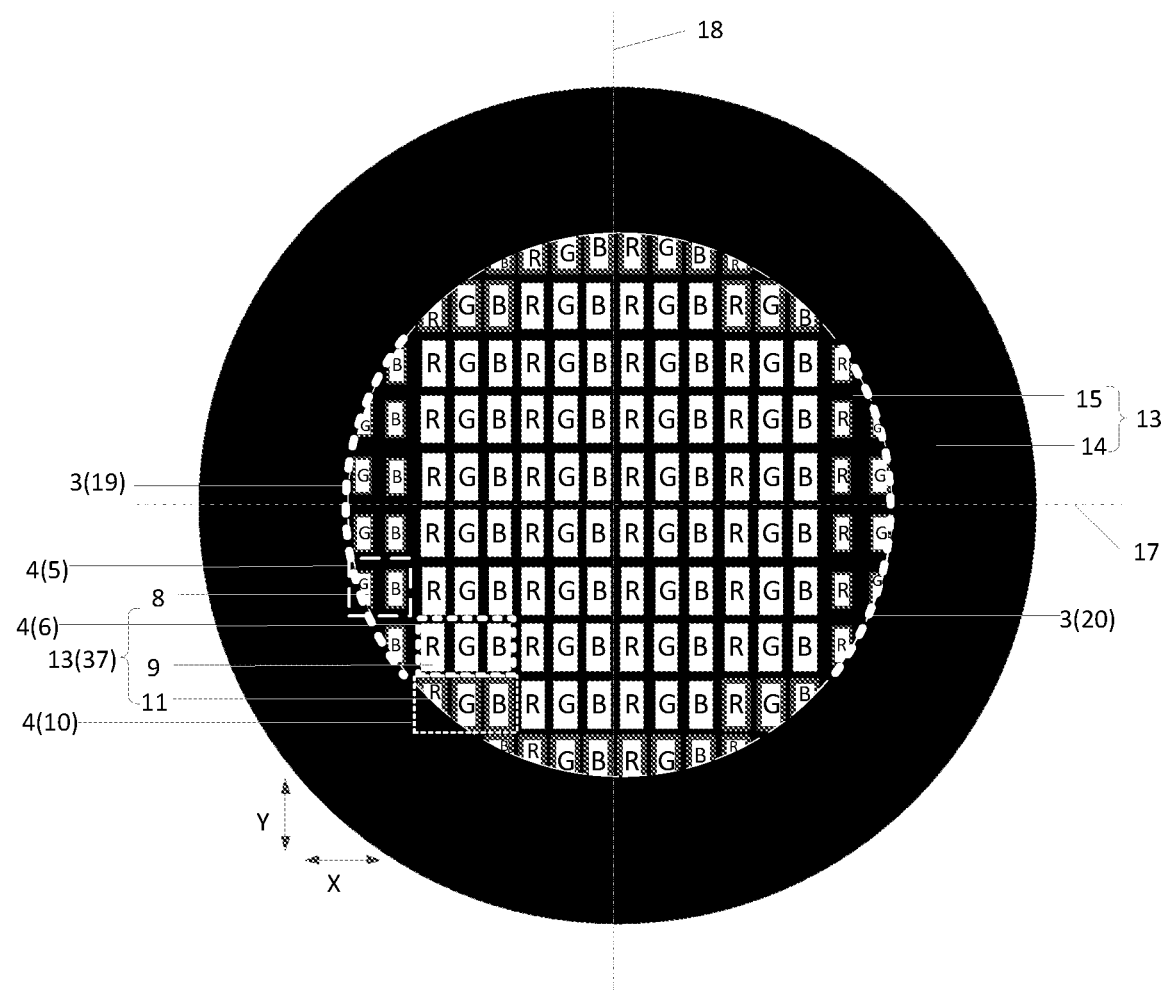
FIG. 2 is a schematic diagram of a sub-pixel opening region of a display panel provided by an embodiment of the present disclosure.

Based on the above problems existing in the related art, embodiments of the present disclosure provide a display panel, as shown in FIG. 1 and FIG. 2, the display panel includes: a display region 1 and at least one non-display region 2 adjacent to the display region 1, where a boundary between the at least one non-display region 2 and the display region 1 has a curve part 3. The display panel includes: a plurality of pixels 4 which are arranged in a first direction X and a second direction Y in an array and include a plurality of first pixels 5 and a plurality of second pixels 6; where each of the plurality of the pixels 4 includes a plurality of sub-pixels 7; the first direction X intersects with the second direction Y; each of the plurality of the first pixels 5 includes at least one first sub-pixel opening region 8 corresponding to at least one sub-pixel 7 and located in the display region 1, at least one first sub-pixel opening region 8 in each first pixel 5 is adjacent to the curve part 3, and a shape of at least part of the at least one first sub-pixel opening region 8 adjacent to the curve part 3 is non-rectangular; each second pixel 6 is located in the display region 1, each second pixel 6 includes second sub-pixel opening regions 9 corresponding to sub-pixels 7, and a shape of each of the second sub-pixel opening regions 9 is rectangular; and a ratio of an area of each first sub-pixel opening region 8 to an area of a sub-pixel 7 corresponding to the first sub-pixel opening region 8 in the display region 1 is less than a ratio of an area of each second sub-pixel opening region 9 to an area of a sub-pixel corresponding to the second sub-pixel opening region 9.

It should be noted that a ratio of an area of each first sub-pixel opening region to an area of a sub-pixel corresponding to the first sub-pixel opening region in the display region is a first aperture ratio, and a ratio of an area of each second sub-pixel opening region to an area of a sub-pixel corresponding to the second sub-pixel opening region is a second aperture ratio; and the ratio of the area of each first sub-pixel opening region 8 to the area of the sub-pixel 7 corresponding to the first sub-pixel opening region 8 in the display region 1 is less than the ratio of the area of each second sub-pixel opening region 9 to the area of the sub-pixel corresponding to the second sub-pixel opening region 9, that is, the first aperture ratio is less than the second aperture ratio.

In the display panel provided by the embodiments of the present disclosure, a shape of at least part of the first sub-pixel opening regions adjacent to the curve part is non-rectangular, that is, a shape of at least part of the opening regions on an edge, close to the non-display region, of the display region is non-rectangular, so that the sawtooth feeling at the boundary between the display region and the non-display region may be reduced. In addition, the ratio of the area of each first sub-pixel opening region to the area of the sub-pixel corresponding to the first sub-pixel opening region in the display region is less than the ratio of the area of each second sub-pixel opening region to the area of the sub-pixel corresponding to the second sub-pixel opening region, that is, the first aperture ratio of each sub-pixel in the first pixels in the display region is less than the second aperture ratio of each sub-pixel in the second pixels. In a case of not changing the sizes of the sub-pixels, it is equivalent to reducing the area of the opening region of each sub-pixel in the first pixels in the display region, to reduce an area of color stripes. Moreover, the difference between the areas of the opening regions of all the sub-pixels in the first pixels may further be reduced, light emitting brightness of the first pixels is reduced, uneven color mixing in a region corresponding to the curve part of the boundary between the display region and the non-display region is improved, so that poor display of the color stripes at the boundary between the display region and the non-display region can be alleviated, the display effect can be improved, and the user experience is improved. On the one hand, the area of the color stripes may be reduced, and on the other hand, the degree of the color stripes can also be greatly improved due to the reduction of the area of the opening regions and the reduction of the brightness.

It should be noted that when there is no other first sub-pixel opening region between the first sub-pixel opening region and the curve part, it is defined that the first sub-pixel opening region is adjacent to the curve part.

It should be noted that FIG. 1 takes a situation that the first direction X is perpendicular to the second direction Y, the first direction is horizontal, and the second direction is vertical as an example for illustration. During specific implementation, the first direction X and the second direction Y may be interchanged, that is, as shown in FIG. 3 and FIG. 4, the first direction X may be vertical, and the second direction Y may be horizontal.

Figure 3:
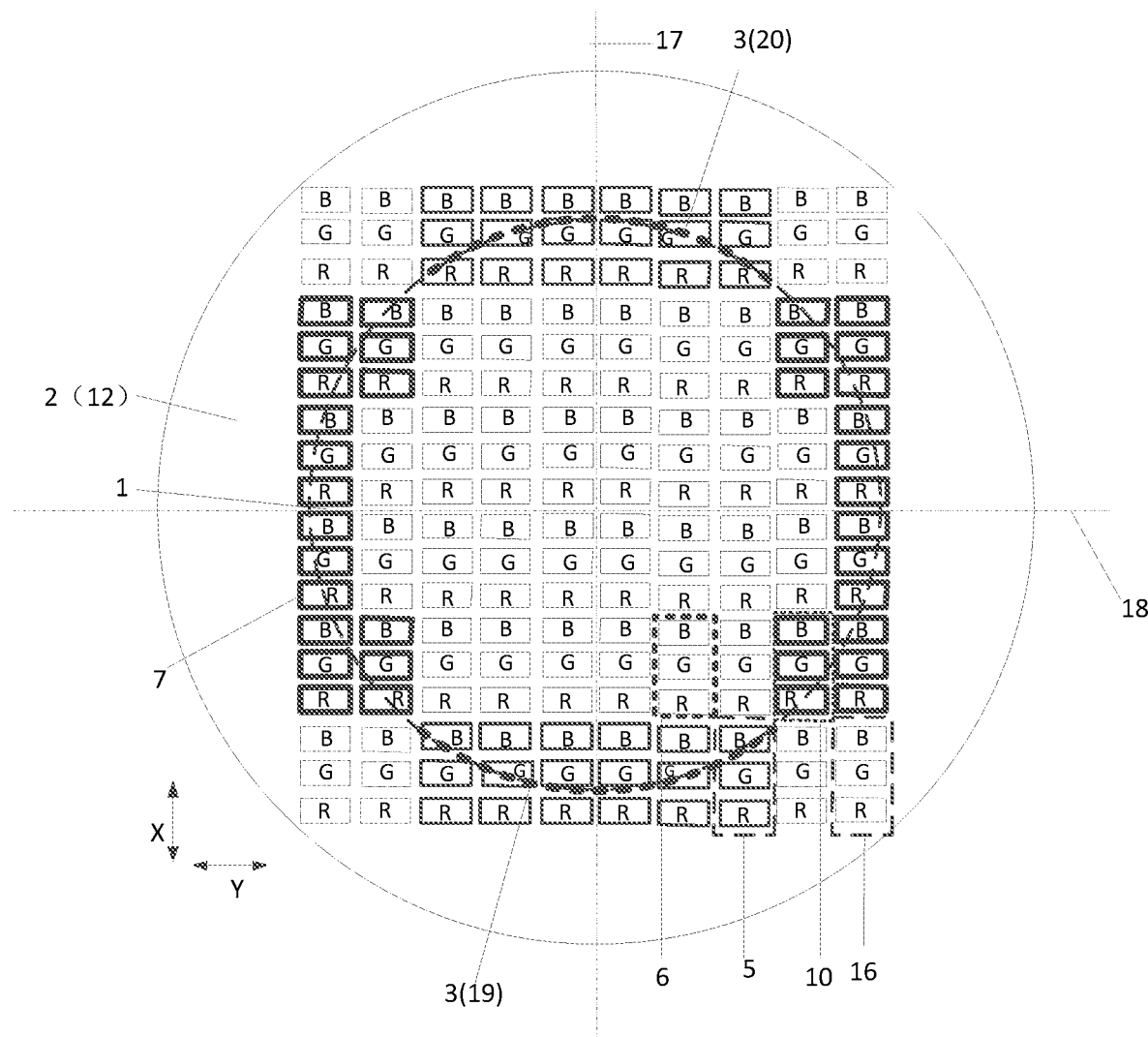
FIG. 3 is a schematic structural diagram of another display panel provided by an embodiment of the present disclosure.
Figure 4:
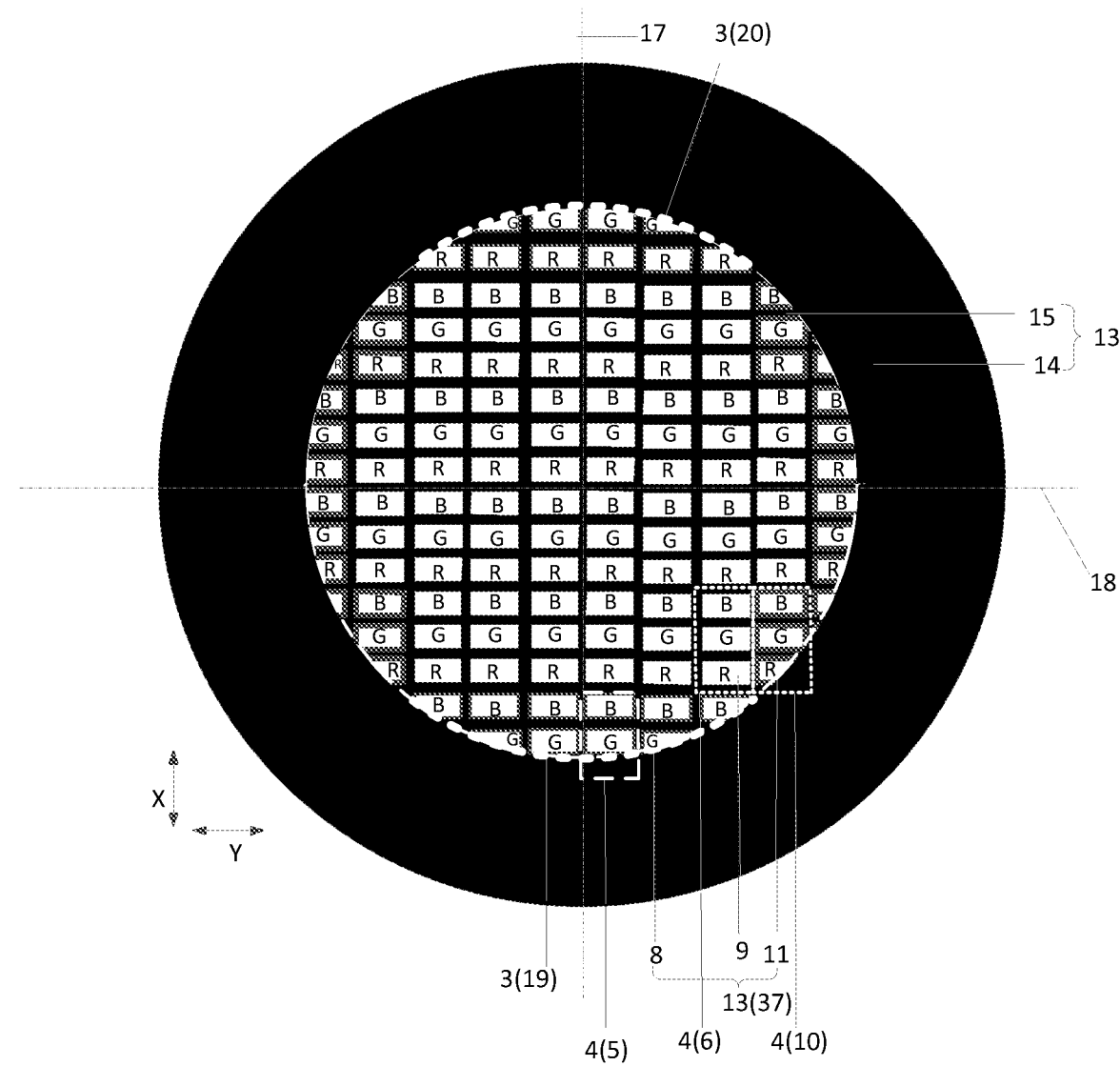
FIG. 4 is a schematic diagram of a sub-pixel opening region of another display panel provided by an embodiment of the present disclosure.

In some embodiments, as shown in FIG. 1 and FIG. 3, a plurality of sub-pixels 7 in each pixel 4 are arranged in the first direction X.

In some embodiments, as shown in FIG. 1 and FIG. 3, each pixel 4 includes a red sub-pixel R, a green sub-pixel G and a blue sub-pixel B.

It should be noted that during specific implementation, when the boundary between the display region and the non-display region includes the curve part, as shown in FIGS. 1 and 3, the non-display region 2 covers part of sub-pixels 7. As shown in FIG. 2 and FIG. 4, part of pixels 4 corresponding to the curve part 3 does not contain the three complete sub-pixel opening regions in the display region 1, that is, the sub-pixels in part of the pixels are completely located in the non-display region. The sub-pixels completely located in the non-display region do not display.

In some embodiments, as shown in FIG. 1 and FIG. 3, a width of each of the sub-pixels 7 in the first direction X is less than a width of each of the sub-pixels 7 in the second direction Y.

In some embodiments, as shown in FIG. 1 and FIG. 3, an area of each of the sub-pixels 7 is equal.

In some embodiments, as shown in FIG. 2 and FIG. 4, in the second pixels 6, an area of each of second sub-pixel opening regions 9 is equal.

In some embodiments, as shown in FIG. 1, FIG. 2, FIG. 3, FIG. 4, FIG. 5 and FIG. 6, the curve part 3 includes at least one circular arc.

In some embodiments, as shown in FIG. 1, FIG. 2, FIG. 3, FIG. 4 and FIG. 6, colors of two adjacent sub-pixels 7 in the first direction X are different, and colors of two adjacent sub-pixels 7 in the second direction Y are the same.

In some embodiments, as shown in FIG. 1, FIG. 2, FIG. 3, FIG. 4 and FIG. 6, a pattern enclosed by the boundary between the non-display region 2 and the display region 1 has a first axis of symmetry 17 parallel to the first direction X and a second axis of symmetry 18 parallel to the second direction Y;
at least one circular arc includes a first arc part 19 and a second arc part 20 with equal radians; the first axis of symmetry 17 bisects the first arc part 19 and the second arc part 20; and the first arc part 19 and the second arc part 20 are symmetrical along the second axis of symmetry 18; and
at least one first sub-pixel opening region 8 in each of first pixels 5 is adjacent to the first arc part 19 or the second arc part 20.

According to the display panel provided by the embodiments of the present disclosure, the first arc part and the second arc part both correspond to the first pixels, at least one first sub-pixel opening region in each first pixel is adjacent to the first arc part or the second arc part, that is, an area of a sub-pixel opening region in each first pixel adjacent to the first arc part or the second arc part in the display region is reduced, so that the difference between the areas of the sub-pixel opening regions in the first pixels corresponding to the first arc part and the second arc part can be reduced, the poor display of color stripes in the regions corresponding to the first arc part and the second arc part can be alleviated, the display effect can be improved, and the user experience is improved.

In some embodiments, as shown in FIG. 1, FIG. 2, FIG. 3 and FIG. 4, at least one non-display region 2 includes a first non-display region 12 surrounding the display region 1; a shape of a region enclosed by the first non-display region 12 is circular; and the curve part 3 includes a circumference corresponding to a boundary between the first non-display region 12 and the display region 1.

In some embodiments, as shown in FIG. 1, FIG. 2, FIG. 3 and FIG. 4, the region enclosed by the first non-display region 12 coincides with the display region 1, that is, the shape of the display region 1 is circular.

Figure 5:
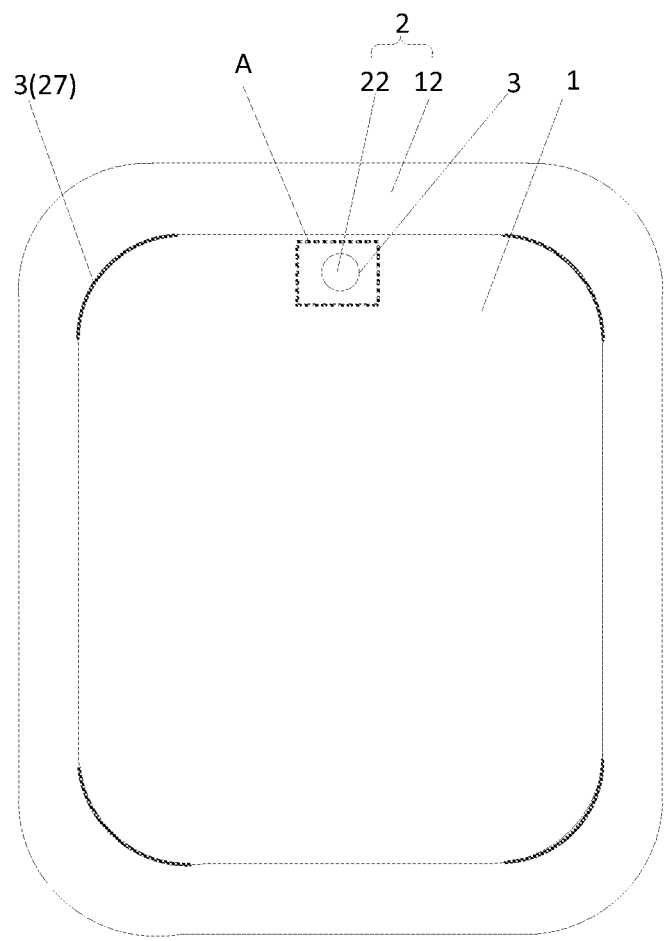
FIG. 5 is a schematic structural diagram of yet another display panel provided by an embodiment of the present disclosure.
Figure 6:
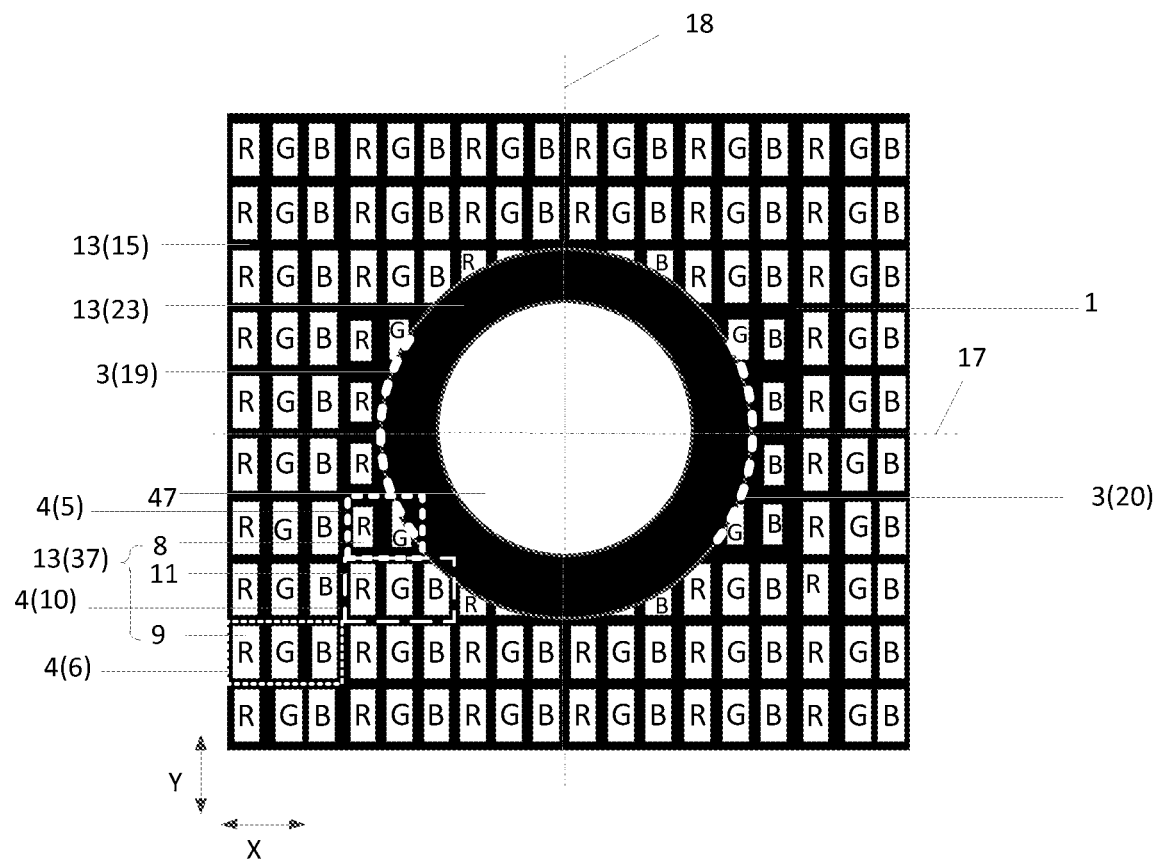
FIG. 6 is a schematic diagram of a sub-pixel opening region of yet another display panel provided by an embodiment of the present disclosure.

Or, in some embodiments, as shown in FIG. 5, at least one non-display region 2 includes a second non-display region 22 enclosed by the display region 1; and a shape of the second non-display region 22 is circular, and the curve part includes a circumference corresponding to a boundary between the second non-display region 22 and the display region 1. During specific implementation, FIG. 6 is a schematic diagram of a sub-pixel opening region in a region A in FIG. 5.

It should be noted that FIG. 1 to FIG. 6 all take a situation that the boundary between one of the non-display regions and the display region is the circumference as an example for illustration. During specific implementation, a pattern enclosed by the boundary between the non-display region including the curve part and the display region may be other shapes, as long as the boundary between the non-display region and the display region includes the first arc part and the second arc part with the equal radians, it may be set that at least one first sub-pixel opening region in each first pixel is adjacent to the first arc part or the second arc part.

In some embodiments, the radian of the first arc part and the radian of the second arc part are both 60°.

It should be noted that positions of the color stripes are related to the arrangement of the pixels. When the widths of the sub-pixels in the first direction X are less than the widths thereof in the second direction Y, the colors of the two adjacent sub-pixels in the first direction X are the same, and the colors of the two adjacent sub-pixels in the second direction Y are different, the color stripes mainly appear in the regions corresponding to the first arc part and the second arc part with the radians of 60°. Taking the situation that the non-display region includes a first non-display region, and the boundary between the first non-display region and the display region includes the first arc part and the second arc part as an example, when the first direction is horizontal and the second direction is vertical, the color stripes mainly appear in edges of left and right sides of the display region; and when the first direction is vertical and the second direction is horizontal, the color stripes mainly appear in edges of upper and lower sides of the display region.

According to the display panel provided by the embodiments of the present disclosure, at least one first sub-pixel opening region in each of the first pixels is adjacent to the first arc part or the second arc part with the radian of 60°, that is, an area of a sub-pixel opening region in each of the first pixels adjacent to the first arc part or the second arc part with the radian of 60° in the display region is reduced, so that the difference between the areas of all the sub-pixel opening regions in the first pixels corresponding to the first arc part and the second arc part can be reduced, the poor display of color stripes in the regions corresponding to the first arc part and the second arc part can be alleviated, the display effect can be improved, and the user experience is improved.

It should be noted that FIG. 1 to FIG. 6 all take the situation that the widths of the sub-pixels in the first direction X are less than the widths thereof in the second direction Y, the colors of the two adjacent sub-pixels in the first direction X are the same, and the colors of the two adjacent sub-pixels in the second direction Y are different as an example for illustration. Of course, during specific implementation, other sub-pixel arrangement modes may also be adopted.

Figure 7:
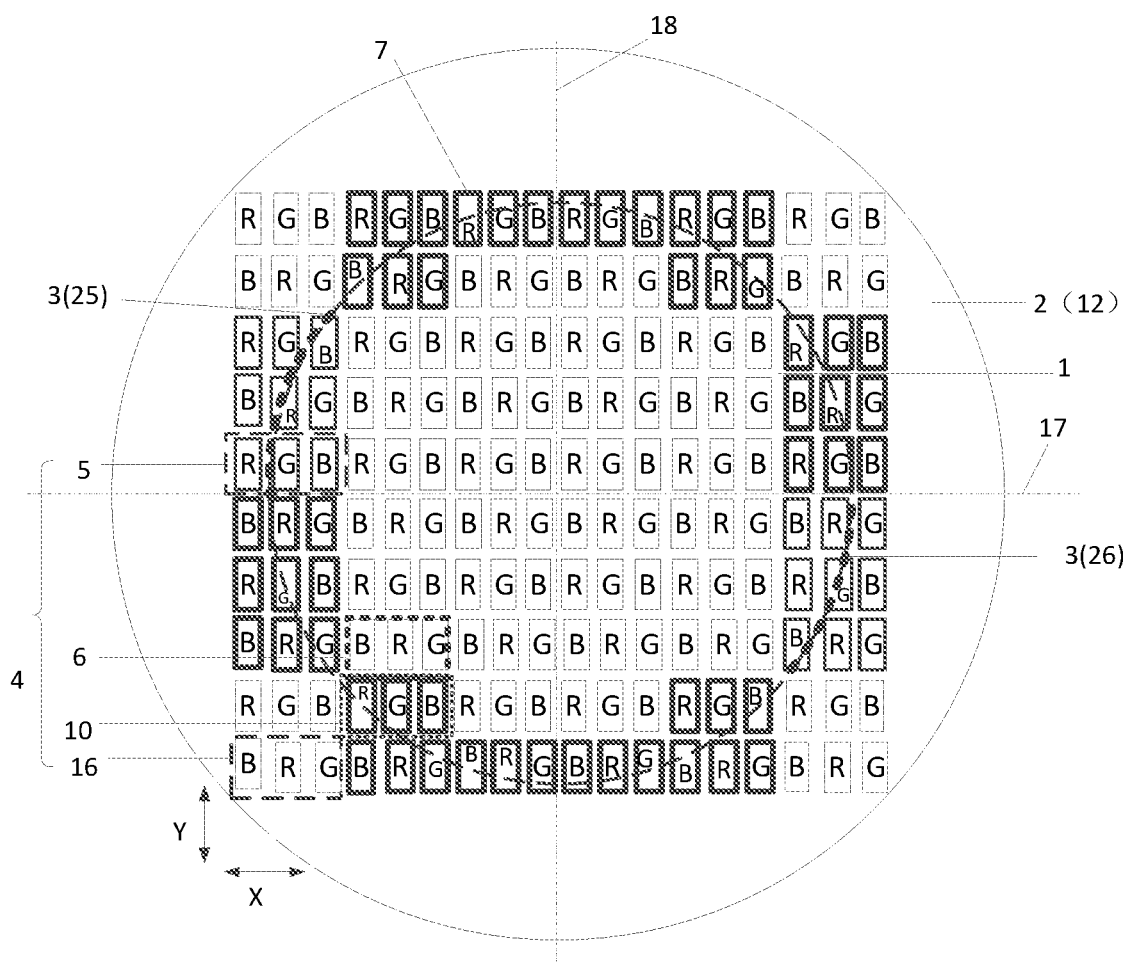
FIG. 7 is a schematic structural diagram of yet another display panel provided by an embodiment of the present disclosure.
Figure 8:
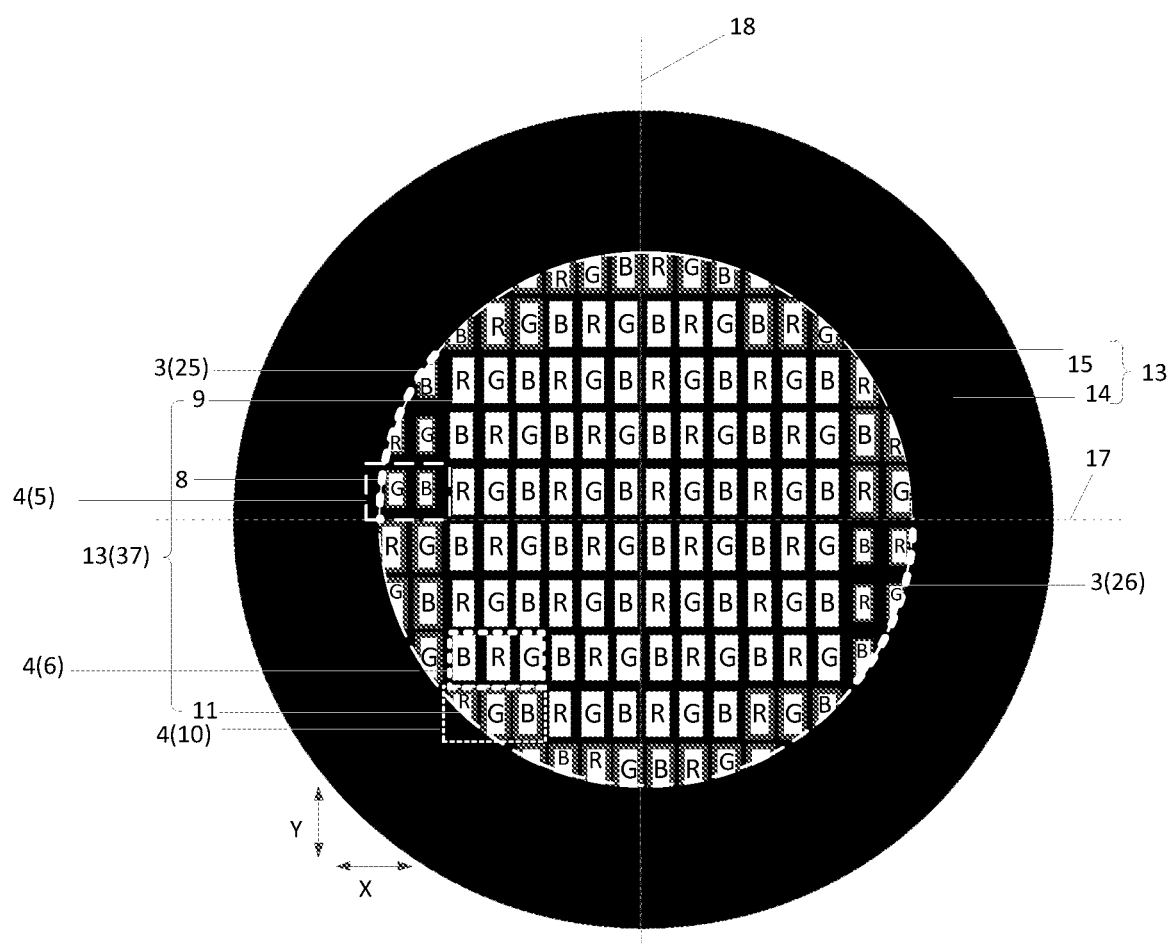
FIG. 8 is a schematic diagram of a sub-pixel opening region of yet another display panel provided by an embodiment of the present disclosure.

In some embodiments, as shown in FIG. 7 and FIG. 8, in the display region 1, the colors of any two adjacent sub-pixels 7 are different;
a pattern enclosed by the boundary between the non-display region 2 and the display region 1 has a first axis of symmetry 17 parallel to the first direction X and a second axis of symmetry 18 parallel to the second direction Y;
the at least one circular arc includes a third arc part 25 and a fourth arc part 26 with equal radians; the third arc part 25 and the fourth arc part 26 are adjacent to the first axis of symmetry 17 on two sides of the first axis of symmetry 17 respectively; and the third arc part 25 and the fourth arc part 26 are in central symmetry; and at least one first sub-pixel opening region 8 in each of the first pixels 5 is adjacent to the third arc part 25 or the fourth arc part 26.

During specific implementation, when the first direction is horizontal, the third arc part is located above the first axis of symmetry, and the fourth arc part is located below the first axis of symmetry.

In some embodiments, the radian of the third arc part and the radian of the fourth arc part are both 30°.

It should be noted that when the widths of the sub-pixels in the first direction X are less than the widths thereof in the second direction Y, and the colors of any two adjacent sub-pixels are different, the color stripes mainly appear in the regions corresponding to the first arc part and the second arc part with the radians of 30°. According to the display panel provided by the embodiments of the present disclosure, the third arc part and the fourth arc part both overlap the first pixels, at least one first sub-pixel opening region in each of the first pixels is adjacent to the third arc part or the fourth arc part, that is, the area of the sub-pixel opening region in each of the first pixels adjacent to the third arc part or the fourth arc part in the display region is reduced, so that the difference between the areas of all the sub-pixel opening regions in the first pixels corresponding to the third arc part and the fourth arc part can be reduced, the poor display of the color stripes in the regions corresponding to the third arc part and the fourth arc part can be alleviated, the display effect can be improved, and the user experience is improved.

It should be noted that as shown in FIG. 7 and FIG. 8, in the second direction Y, a red sub-pixel R in one pixel 4 is adjacent to a green sub-pixel G in an adjacent pixel of the one pixel 4, a green sub-pixel G in the one pixel 4 is adjacent to a blue sub-pixel B in the adjacent pixel of the one pixel 4, and a blue sub-pixel B in the one pixel 4 is adjacent to a red sub-pixel R in the adjacent pixel of the one pixel 4. Of course, the sub-pixels may also be arranged in other orders, as long as the colors of any two adjacent sub-pixels are different.

It should be noted that FIG. 7 and FIG. 8 take a situation that the non-display region includes a first non-display region surrounding the display region, and the boundary between the first non-display region and the display region includes the third arc part and the fourth arc part as an example for illustration. During specific implementation, when the non-display region includes a second non-display region enclosed by the display region, and a boundary between the second non-display region and the display region includes the third arc part and the fourth arc part, at least one first sub-pixel opening region in each of the first pixels is adjacent to the third arc part or the fourth arc part, close to the second non-display region, in the display region.

It should be noted that FIG. 7 and FIG. 8 take a situation that the boundary between one of the non-display regions and the display region is the circumference as an example for illustration. During specific implementation, the pattern enclosed by the boundary between the non-display region including the curve part and the display region may also be other shapes. In a case that the colors of any two adjacent sub-pixels are different, as long as the boundary between the non-display region and the display region includes the third arc part and the fourth arc part, it may be set that at least one first sub-pixel opening region in each of the first pixels is adjacent to the third arc part or the fourth arc part.

It should be noted that FIG. 1 to FIG. 4 and FIG. 7 to FIG. 8 take a situation that the shape enclosed by the first non-display region is circular as an example for illustration. Of course, the shape enclosed by the first non-display region may also be other shapes.

Figure 9:
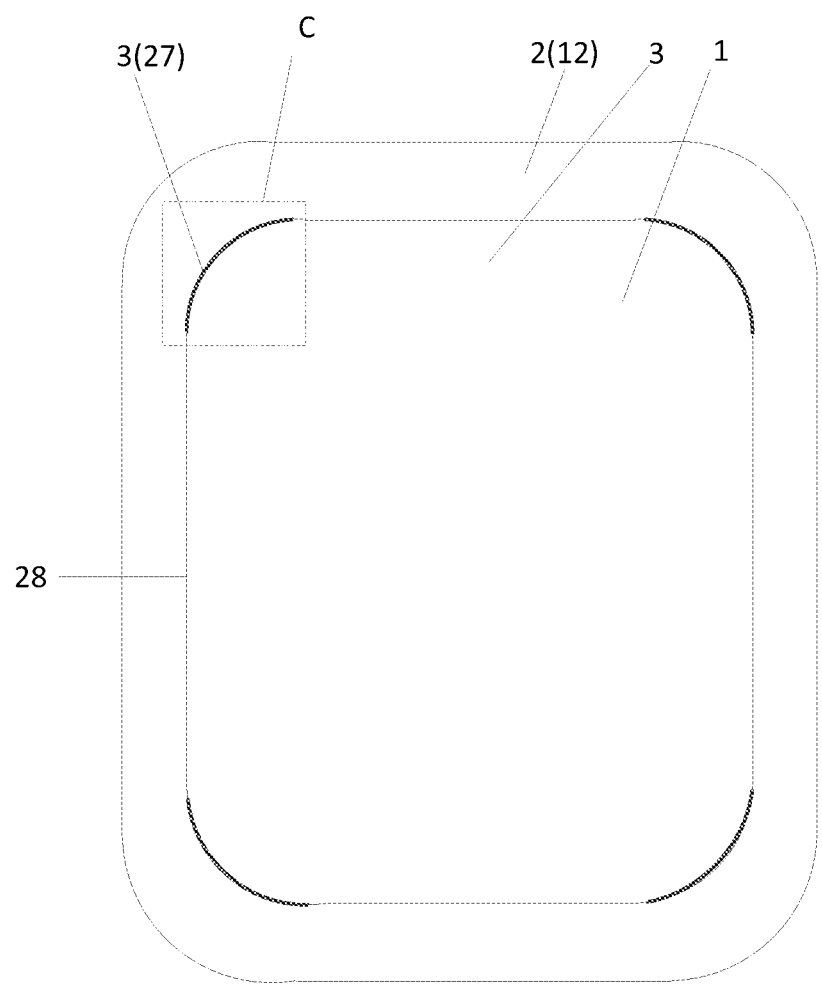
FIG. 9 is a schematic structural diagram of yet another display panel provided by an embodiment of the present disclosure.

In some embodiments, as shown in FIG. 5 and FIG. 9, the shape enclosed by the first non-display region 12 is a rounded rectangle. The curve part 3 includes: four rounded corner parts 27 of a boundary between the display region 1 and the first non-display region 12.

During specific implementation, as shown in FIG. 5, the overall shape of the display region 1 and the second non-display region 22 is a rounded rectangle. As shown in FIG. 9, the shape of the display region 1 is a rounded rectangle.

Next, the display panel shown in FIG. 9 is taken as an example for illustration. In some embodiments, as shown in FIG. 9, the boundary between the first non-display region 12 and the display region 1 further includes a first straight line part 28 parallel to the second direction Y, and two ends of the first straight line part 28 are connected with a rounded corner part 27 respectively; and a radian of the rounded corner part 27 is less than or equal to 90° and larger than 60°.

Figure 10:
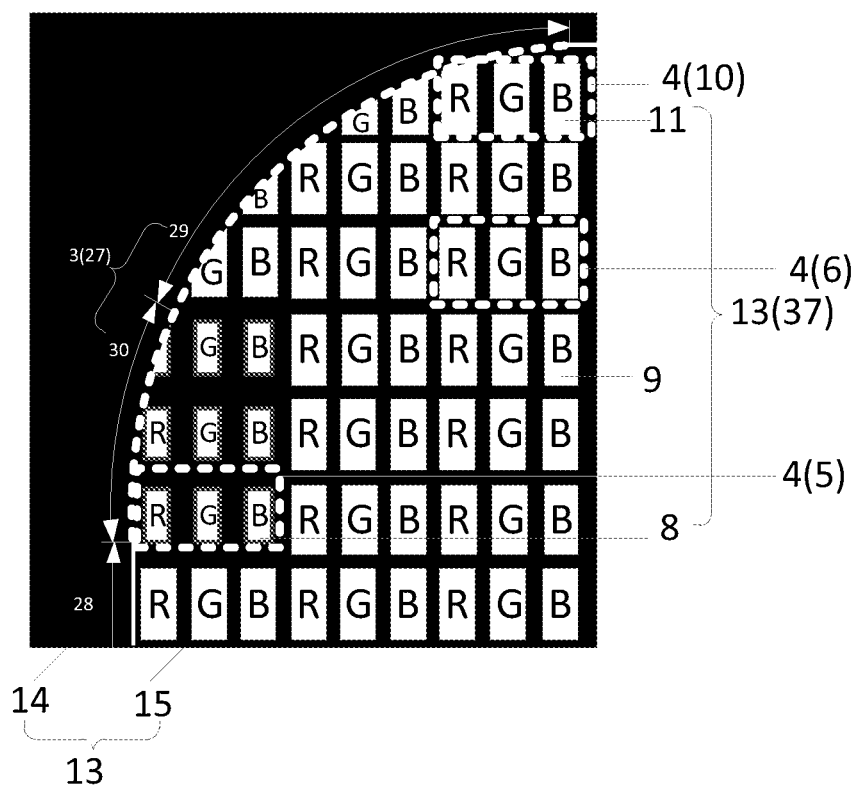
FIG. 10 is a schematic diagram of a sub-pixel opening region of yet another display panel provided by an embodiment of the present disclosure.

As shown in FIG. 10, each of rounded corner parts 27 is divided into: a first part 29 and a second part 30; a radian of the first part is 60°, and the second part 30 is connected with the first straight line part 28; and at least one first sub-pixel opening region 8 in each of the first pixels 5 is adjacent to the second part 30.

It should be noted that FIG. 10 is a schematic diagram of sub-pixel opening regions in a region C in FIG. 9.

It should be noted that when the radian of each rounded corner part is less than or equal to 90° and larger than 60°, the color stripes mainly appear in a region corresponding to the 35 second part.

According to the display panel provided by the embodiments of the present disclosure, at least one first sub-pixel opening region in each of the first pixels is adjacent to the second part, that is, an area of the sub-pixel opening region in each of the first pixels adjacent to the second part in the display region is reduced, so that the difference between the areas of all the sub-pixel opening regions in the first pixels corresponding to the second part can be reduced, the poor display of the color stripes in a region corresponding to the second part can be alleviated, the display effect can be improved, and the user experience is improved.

It should be noted that the pixels arranged in an array may be divided into a plurality of pixel rows extending in the first direction and arranged in the second direction. In FIG. 1 to FIG. 10, a situation that part of pixel rows corresponding to the curve part includes first pixels, and the rest of pixel rows corresponding to the curve part does not include the first pixels is taken as an example for illustration.

Of course, during specific implementation, it may also be that each pixel row corresponding to the curve part includes the first pixels. Next, the situation that the non-display region includes a first non-display region, and the display region is circular is taken as an example for illustration.

Figure 11:
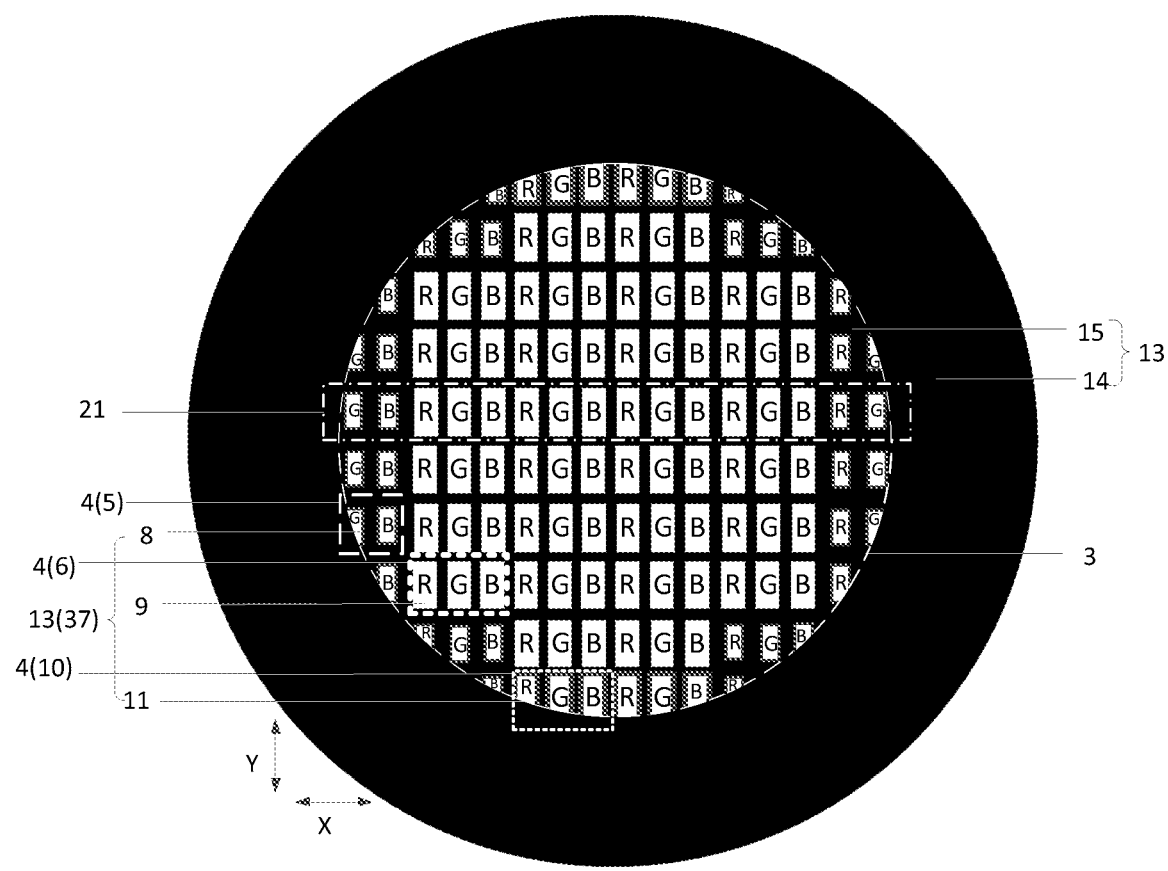
FIG. 11 is a schematic diagram of a sub-pixel opening region of yet another display panel provided by an embodiment of the present disclosure.

In some embodiments, as shown in FIG. 11, when colors of two adjacent sub-pixels in the first direction X are different, and colors of two adjacent sub-pixels in the second direction Y are the same, the plurality of pixels 4 are divided into a plurality of pixel rows 21 arranged in the second direction Y, and each pixel row 21 includes a plurality of pixels 4 arranged in the first direction X; and in the display region, in each pixel row 21, the pixel 4 closest to the circular arc is the first pixel 5.

That is, in the display panel provided by the embodiments of the present disclosure, each pixel row corresponding to the circular arc is provided with a first pixel with a reduced area of the sub-pixel opening region, and the first pixel is the pixel, closest to the circular arc, of each pixel row in the display region, so that the difference between the areas of all the sub-pixel opening regions in the pixels, closest to the circular arc, of each pixel row in the display region can be reduced, the poor display of the color stripes in an arc boundary between the display region and the non-display region can be alleviated, the display effect can be improved, and the user experience is improved.

When the curve part is the circumference corresponding to the boundary between the first non-display region and the display region, in some embodiments, as shown in FIG. 11, the first pixel and the last pixel in each pixel row 21 in the display region are the first pixels 5.

It should be noted that FIG. 11 takes the circumference corresponding to the boundary between the first non-display region and the display region as an example for illustration, during specific implementation, for a circular arc, when a radian of the circular arc is less than or equal to 180°, there is only one pixel closest to the arc in each pixel row in the display region; and when the radian of the circular arc is larger than 180°, there are two pixels closest to the circular arc in at least part of pixel rows in the display region. Of course, when the boundary between the display region and the non-display region includes a plurality of circular arcs, there may be a situation that a pixel row corresponds to two circular arcs. In this way, the pixels, closest to the two circular arcs, in the pixel row respectively are the first pixels. For example, when the shape of the display region is a rounded rectangle, in the region corresponding to the rounded corner parts, each pixel row corresponds to two rounded corner parts; and the pixels, closest to the two rounded corner parts, of each pixel row respectively are the first pixels.

It should be noted that during specific implementation, the display panel may only include a non-display region. For example, as shown in FIG. 1, FIG. 3, FIG. 7 and FIG. 9, the non-display region 2 only includes a first non-display region 12. Or, during specific implementation, the display panel may include a plurality of non-display regions. For example, as shown in FIG. 5, the plurality of non-display regions 2 include a first non-display region 12 and a second non-display region 22. During specific implementation, when the display panel includes a plurality of non-display regions, it may be that the boundary between one of the plurality of non-display regions and the display region has the curve part, or the boundary between each non-display region and the display region has the curve part.

In some embodiments, as shown in FIG. 1 to FIG. 4, FIG. 6 to FIG. 8 and FIG. 10 to FIG. 11, the plurality of pixels 4 further include: a plurality of third pixels 10 adjacent to the curve part 3 in a region other than the first pixels 5;

each third pixel 10 includes at least one third opening region 11 located in the display region 1, at least one third opening region 11 in each of the third pixels 10 is adjacent to the curve part 3, and a shape of at least part of the at least one third opening region 11 adjacent to the curve part 3 is non-rectangular; and a radio of an area of each third opening region 11 to an area of a sub-pixel 7 corresponding to the third opening region 11 in the display region 1 is equal to a ratio of an area of the second opening region 9 to an area of the sub-pixel 7 in the second pixel 6.

It should be noted that the ratio of the area of each third opening region to the area of a sub-pixel corresponding to the third opening region in the display region is equal to the ratio of the area of the second opening region to the area of a sub-pixel in the second pixel, that is, there is no need to reduce the area of the third sub-pixel opening region. The third pixels are usually arranged in the region where the color stripes are not prone to appearing. Therefore, even if the areas of the third sub-pixel opening regions in the third pixels are not changed, the reality effect may not be seriously affected.

Figure 12:
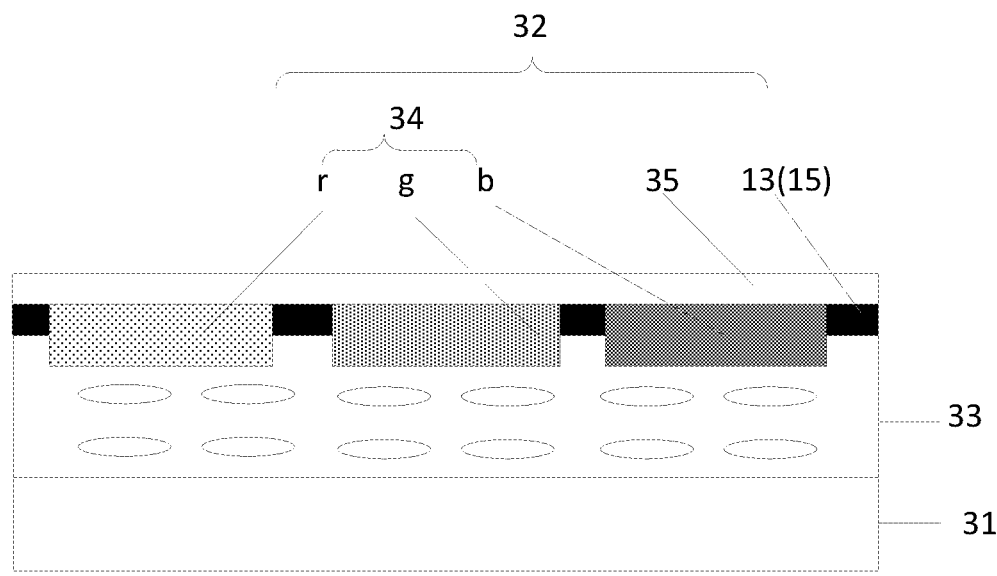
FIG. 12 is a schematic cross-sectional view of a display panel provided by an embodiment of the present disclosure.
Figure 13:
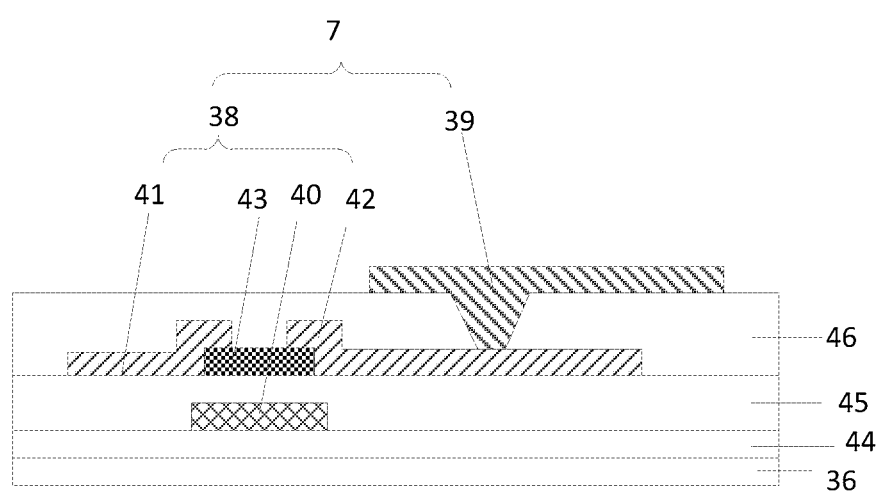
FIG. 13 is a schematic cross-sectional view of an array substrate provided by an embodiment of the present disclosure.

In some embodiments, as shown in FIG. 12, the display panel includes:
an array substrate 31, as shown in FIG. 13, including: a first base substrate 36 and sub-pixels 7 located on one side of the first base substrate;
an opposite substrate 32, arranged opposite to the array substrate 31, where the opposite substrate 32 includes: a second base substrate 35 and a light shielding layer 13 located on one side, facing the array substrate 31, of the second base substrate 35; and
a liquid crystal layer 33, located between the array substrate 31 and opposite substrate 32.

That is, the display panel provided by the embodiments of the present application is a liquid crystal display panel.

During specific implementation, the array substrate further includes a plurality of scanning lines and data lines crossing each other horizontally and vertically, and the scanning lines and the data lines define the region of the sub-pixels. In some embodiments, as shown in FIG. 13, each sub-pixel 7 includes: a thin film transistor 38, and a pixel electrode 39 electrically connected with the thin film transistor 38. The thin film transistor 38 includes: a gate 40, a source 41, a drain 42 and an active layer 43. FIG. 13 takes a situation that the thin film transistor is a bottom-gate structure as an example for illustration; and the array substrate 31 further includes: a buffer layer 44 located between the gate 40 and the first base substrate 36, a gate insulating layer 45 located between the gate 40 and the active layer 43, and a passivation layer 46 located between the drain 42 and the pixel electrode 39. During specific implementation, the gates of the thin film transistors are electrically connected with the scanning lines, the sources of the thin film transistors are electrically connected with the data lines, and the drains of the thin film transistors are electrically connected with the pixel electrodes. The array substrate or the opposite substrate further includes a common electrode.

In some embodiments, as shown in FIG. 2, FIG. 4, FIG. 8, FIG. 10 and FIG. 11, the light shielding layer 13 includes: a first light shielding part 14, a second light shielding part 15 and a plurality of sub-pixel opening regions 37. An orthographic projection of the first light shielding part 14 on the first base substrate falls into the first non-display region 12; an edge of one side of the orthographic projection, close to the display region, of the first light shielding part 14 on the first base substrate coincides with the boundary between the first non-display region and the display region; and the orthographic projection of the first light shielding part 14 on the first base substrate covers an orthographic projection of at least part of first pixels 5 on the first base substrate. The second light shielding part 15 is located between adjacent sub-pixel opening regions 37; and the plurality of sub-pixel opening regions 37 include: a plurality of first sub-pixel opening regions 8 and a plurality of second sub-pixel opening regions 9.

In some embodiments, as shown in FIG. 2, FIG. 4, FIG. 8, FIG. 10 and FIG. 11, an orthographic projection of a region enclosed by the first light shielding part 14 on the second base substrate coincides with the display region.

According to the display panel provided by the embodiments of the present application, the boundary between the display region and the first non-display region is limited through the first light shielding part, and the sizes of the sub-pixel opening regions are limited through the second light shielding part. When the boundary between the display region and the first non-display region includes the curve part, that is, the shape enclosed by the first non-display region is non-rectangular, the first light shielding part covers part of the sub-pixels, and the range of the display region is limited through the first light shielding part, which is simple in process and easy to implement.

During specific implementation, as shown in FIG. 1, FIG. 3 and FIG. 7, the sub-pixels 7 are arranged in a rectangular array, that is, the number of the sub-pixels 7 in each row is the same, the number of the sub-pixels 7 in each column is the same, and subsequently, the range of the display region may be limited through the first light shielding part. In this way, in a case that the sizes of the sub-pixels are the same, a mask plate used in a patterning process of a display panel in a rectangular display region may be applied to the manufacturing of a display panel in a non-rectangular display region, which can save costs. It should be noted that: in some embodiments, as shown in FIG. 1, FIG. 3 and FIG. 7, a plurality of pixels 4 further include: dummy pixels 16 completely located in the first non-display region 12. That is, the dummy pixels 16 are completely covered by the first light shielding part. Of course, during specific implementation, the array pattern of sub-pixels in the array substrate may be set according to actual needs.

It should be noted that FIG. 2, FIG. 4, FIG. 8, FIG. 10 and FIG. 11 take a situation that the shape enclosed by the first non-display region is circular as an example for illustration. When the display panel is a liquid crystal display panel, during specific implementation, no matter whether the shape enclosed by the first non-display region is circular or rounded rectangular or other non-rectangular, the shape of the region enclosed by the first non-display region may be limited through the first light shielding part.

In some embodiments, as shown in FIG. 6, the light shielding layer 14 further includes: a third light shielding part 23 and a first opening region 47 enclosed by the third light shielding part 23; and orthographic projections of the third light shielding part 23 and the first opening region 47 on the first base substrate coincide with the second non-display region.

During specific implementation, the second non-display region, for example, needs to be provided with devices such as a camera. The devices, such as the camera, are arranged in the first opening region.

In some embodiments, as shown in FIG. 2, FIG. 4, FIG. 8, FIG. 10 and FIG. 11, when the plurality of pixels 4 further include the third pixels 10, the plurality of sub-pixel opening regions 37 further include: third sub-pixel opening regions 11.

In some embodiments, as shown in FIG. 12, the opposite substrate 32 further includes: a plurality of color resistors 34 located on one side, facing the liquid crystal layer 33, of the second base substrate 36; and the color resistors 34 are located in the opening regions.

When the pixel includes: a red sub-pixel, a green sub-pixel, a blue sub-pixel and a white sub-pixel, in some embodiments, as shown in FIG. 12, the plurality of color resistors 34 include: a red color resistor r corresponding to the red sub-pixel, a green color resistor g corresponding to the green sub-pixel and a blue color resistor b corresponding to the blue sub-pixel.

In some embodiments, as shown in FIG. 1 to FIG. 4, FIG. 6 to FIG. 8 and FIG. 10 to FIG. 11, the sub-pixel in each first pixel 5 only corresponds to one first sub-pixel opening region 8.

In some embodiments, when the sub-pixel in each first pixel only corresponds to one first sub-pixel opening region, in the first direction, a distance between two adjacent first sub-pixel opening regions is larger than a distance between two adjacent second sub-pixel opening regions; and in the second direction, a distance between two adjacent first sub-pixel opening regions is larger than a distance between two adjacent second sub-pixel opening regions.

Figure 14:
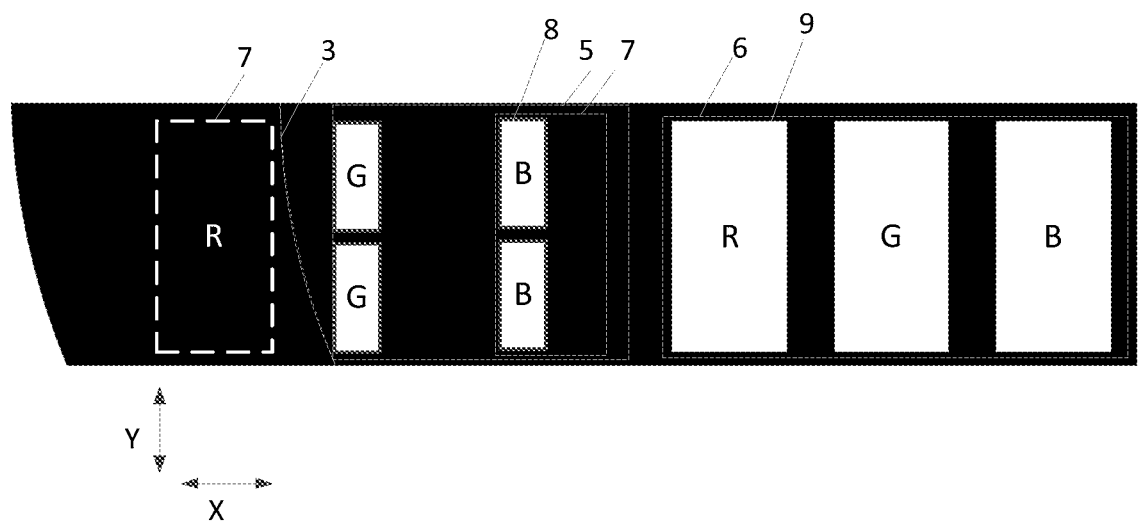
FIG. 14 is a schematic diagram of a sub-pixel opening region of yet another display panel provided by an embodiment of the present disclosure.
Figure 15:
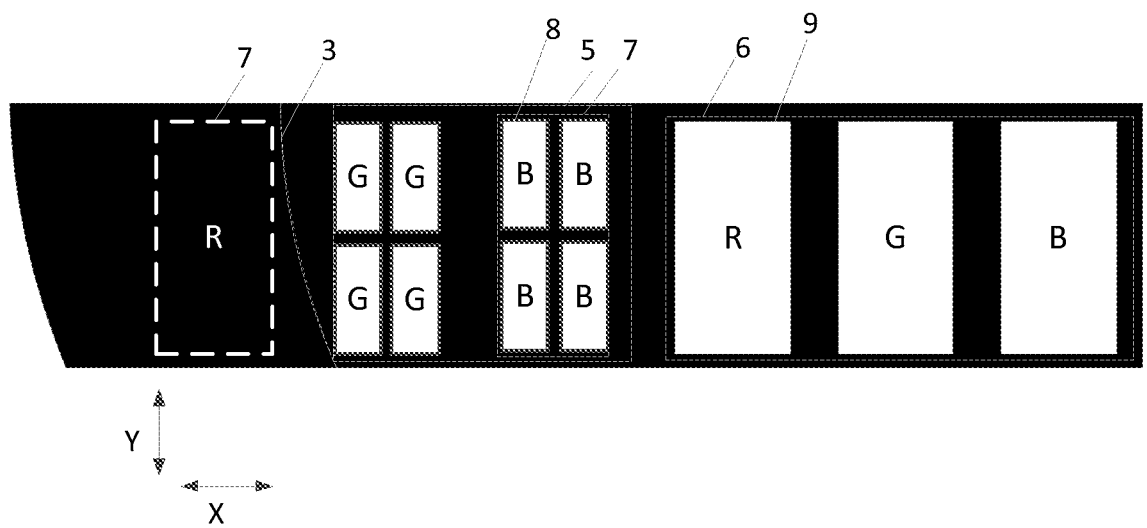
FIG. 15 is a schematic diagram of a sub-pixel opening region of yet another display panel provided by an embodiment of the present disclosure.

Or, in some embodiments, as shown in FIG. 14 and FIG. 15, at least part of sub-pixels 7 in each of the first pixels 5 corresponds to a plurality of first sub-pixel opening regions 8.

That is, according to the display panel provided by the embodiments of the present disclosure, at least part of sub-pixels in the first pixels corresponds to a plurality of sub-pixel opening regions, to reduce an area of a total opening region of sub-pixels in the first pixels in the display region, so that the difference between the areas of the opening regions corresponding to sub-pixels in the first pixels can be reduced, uneven color mixing occurring in a region corresponding to the curve part of the boundary between the display region and the non-display region is improved, thus the poor display of the color stripes at the boundary between the display region and the non-display region can be alleviated, the display effect can be improved, and the user experience is improved.

It should be noted that FIG. 14 and FIG. 15 only show a partial region of the display panel.

During specific implementation, the size of each first sub-pixel opening region and the number of the first sub-pixel opening regions corresponding to one sub-pixel may be set according to actual sub-pixel size and process capability.

In some embodiments, as shown in FIG. 14 and FIG. 15, the plurality of first sub-pixel opening regions 8 are arranged in the first direction X and/or the second direction Y.

FIG. 14 takes a situation that one sub-pixel in the first pixel 5 corresponds to two first sub-pixel opening regions 8 as an example for illustration, and one sub-pixel and two first sub-pixel opening regions are arranged in the second direction Y. FIG. 15 takes a situation that one sub-pixel in the first pixel 5 corresponds to four first sub-pixel opening regions 8 as an example for illustration, and one sub-pixel and four first sub-pixel opening regions 8 are arranged in two rows and two columns in the first direction X and the second direction Y.

In some embodiments, as shown in FIG. 14 and FIG. 15, one sub-pixel in each second pixel 9 corresponds to one second sub-pixel opening region 9.

In some embodiments, a ratio of the first aperture ratio to the second aperture ratio is larger than or equal to 16.8% and less than or equal to 31.6%.

It should be noted that during specific implementation, if the difference between the first aperture ratio and the second aperture ratio is small, the alleviating effect of the color stripes is poor; and if the difference between the first aperture ratio and the second aperture ratio is too large, there may be other practical problems. Therefore, in a case that the second aperture ratio is determined, a suitable first aperture ratio needs to be selected, to realize environmental color stripes without causing other display problems.

Figure 16:
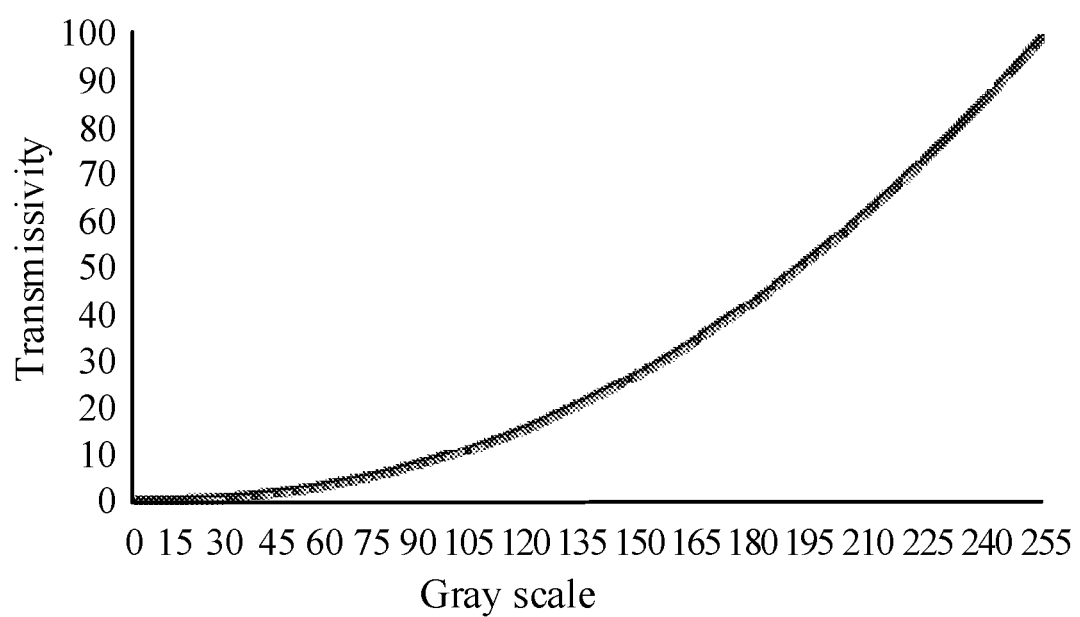
FIG. 16 is a schematic diagram of a gamma curve provided by an embodiment of the present disclosure.

It should be noted that the ratio of the first aperture ratio to the second aperture ratio may be selected according to the actual needs, for example, considering the areas of the sub-pixels, the areas of the second sub-pixel opening regions and the like. During specific implementation, a situation that the sub-pixel in the first pixel correspond to one first sub-pixel opening region is taken as an example, for example, for a circular screen of 23.6 inch, when the area of the sub-pixel is 156.1 μm×468.3 μm, the area of the second sub-pixel opening region is 132.1 μm×364.7 μm=47516 μm$^2$, that is, the second aperture ratio is 65%, a gray scale is L255, a transmissivity of a gray scale is 100%, a transmissivity of a gray scale L127 is selected as a transmissivity of the second pixel through a gamma curve shown in FIG. 16, and the transmissivity of L127 is 21.6%, that is, the ratio of the first aperture ratio to the second aperture ratio is 21.6%. The area of a rectangular opening region corresponding to the transmissivity of 21.6% is 21.6%×47516=10234 μm$^2$, a width of the rectangular opening region corresponding to each first sub-pixel opening region in the first direction is 58.4 μm, and a width of the rectangular opening region corresponding to each first sub-pixel opening region in the second direction is 175.2 μm. For example, when the area of the sub-pixel is 91.5 μm×274.5 μm, the area of the second sub-pixel opening region is 15044.9 μm$^2$, a transmissivity of a gray scale of L151 may be selected as the transmissivity of the second pixel, and the transmissivity of L151 is 31.6%, that is, the ratio of the first aperture ratio to the second aperture ratio is 31.6%. For example, when the area of the sub-pixel is 68.6 μm×205.8 μm, the area of the second sub-pixel opening region is 8018.9 μm$^2$, a transmissivity of a gray scale of L113 may be selected as the transmissivity of the second pixel, and the transmissivity of L113 is 16.8%, that is, the ratio of the first aperture ratio to the second aperture ratio is 16.8%.

Embodiments of the present disclosure provide a display apparatus, including the display panel provided by the embodiments of the present disclosure.

In some embodiments, when the display panel is a liquid crystal display panel, the display apparatus further includes a backlight module; and the display panel is located on a light emitting side of the backlight module.

The display apparatus provided the embodiments of the present disclosure is a mobile phone, a tablet computer, a television, a display, a laptop, a digital photo frame, a navigator and any product or component with a display function. Other essential components of the display apparatus shall be understood by those of ordinary skill in the art, are omitted herein and also shall not become a restriction to the present disclosure. Implementation of the display apparatus may refer to the embodiment of the above display panel, and repetitions are omitted herein.

To sum up, in the display panel and the display apparatus provided by the embodiments of the present disclosure, a shape of at least part of the first sub-pixel opening regions adjacent to the curve part is non-rectangular, that is, the shape of at least part of the opening regions on the edge, close to the non-display region, of the display region is non-rectangular, so that the sawtooth feeling at the boundary between the display region and the non-display region may be reduced. In addition, the ratio of the area of each first sub-pixel opening region to the area of the sub-pixel corresponding to the first sub-pixel opening region in the display region is less than the ratio of the area of each second sub-pixel opening region to the area of the sub-pixel corresponding to the second sub-pixel opening region, that is, the first aperture ratio of each sub-pixel in the first pixels in the display region is less than the second aperture ratio of each sub-pixel in the second pixels. In a case of not changing the sizes of the sub-pixels, it is equivalent to reducing the area of the opening region of each sub-pixel in the first pixels in the display region, to reduce an area of color stripes. Moreover, the difference between the areas of the opening regions of all the sub-pixels in the first pixels may further be reduced, light emitting brightness of the first pixels is reduced, uneven color mixing in a region corresponding to the curve part of the boundary between the display region and the non-display region is improved, so that poor display of the color stripes at the boundary between the display region and the non-display region can be alleviated, the display effect can be improved, and the user experience is improved. On the one hand, the area of the color stripes may be reduced, and on the other hand, the degree of the color stripes can also be greatly improved due to the reduction of the area of the opening regions and the reduction of the brightness.

Although the preferred embodiments of the present disclosure have been described, those skilled in the art can make additional changes and modifications on these embodiments once they know the basic creative concept. So the appended claims are intended to include the preferred embodiments and all changes and modifications that fall into the scope of the present disclosure.

Apparently, those skilled in the art can perform various changes and modifications on the embodiments of the present disclosure without departing from the spirit and scope of the embodiments of the present disclosure. Therefore, if these changes and modifications on the embodiments of the present disclosure fall in the scope of the claims of the present disclosure and their equivalent technologies, the present disclosure is intended to include these changes and modifications.

What is claimed is:

1. A display panel, comprising: a display region and at least one non-display region adjacent to the display region, wherein a boundary between the at least one non-display region and the display region has a curve part;
    wherein the display panel comprises: a plurality of pixels arranged in a first direction and a second direction in an array; wherein the first direction intersects with the second direction;
    wherein the plurality of pixels comprise: a plurality of first pixels and a plurality of second pixels, and each of the plurality of pixels comprises a plurality of sub-pixels;
    each of the plurality of first pixels comprises at least one first sub-pixel opening region corresponding to at least one sub-pixel and disposed in the display region, the at least one first sub-pixel opening region in each of the plurality of first pixels is adjacent to the curve part, and a shape of at least part of the at least one first sub-pixel opening region adjacent to the curve part is non-rectangular;
    each of the plurality of second pixels is disposed in the display region, each of the plurality of second pixels comprises a second sub-pixel opening region corresponding to a sub-pixel, and a shape of the second sub-pixel opening region is rectangular; and
    a ratio of an area of each first sub-pixel opening region to an area of a sub-pixel corresponding to the each first sub-pixel opening region in the display region is less than a ratio of an area of the second sub-pixel opening region to an area of the sub-pixel in the second pixel;
    wherein the curve part comprises at least one circular arc;
    wherein a pattern enclosed by the boundary between the non-display region and the display region has a first axis of symmetry parallel to the first direction and a second axis of symmetry parallel to the second direction;

wherein colors of two adjacent sub-pixels in the first direction are different, and colors of two adjacent sub-pixels in the second direction are same; the at least one circular arc comprises a first arc part and a second arc part with equal radians; the first axis of symmetry bisects the first arc part and the second arc part, and the first arc part and the second arc part are symmetrical along the second axis of symmetry; and at least one first sub-pixel opening region in each of the plurality of the first pixels is adjacent to the first arc part or the second arc part;

or, in the display region, colors of any two adjacent sub-pixels are different; the at least one circular arc comprises a third arc part and a fourth arc part with equal radians; the third arc part and the fourth arc part are adjacent to the first axis of symmetry on two sides of the first axis of symmetry respectively, and the third arc part and the fourth arc part are in central symmetry; and at least one first sub-pixel opening region in each of the first pixels is adjacent to the third arc part or the fourth arc part.

2. The display panel according to claim 1, wherein the radians of the first arc part and the second arc part are both 60°.

3. The display panel according to claim 1, wherein the radian of the third arc part and the fourth arc part are both 30°.

4. The display panel according to claim 1, wherein a shape of the display region is circular;

the at least one non-display region comprises: a first non-display region surrounding the display region; and the curve part comprises a circumference corresponding to the boundary between the first non-display region and the display region.

5. The display panel according to claim 4, comprising:

an array substrate, comprising: a first base substrate and the plurality of sub-pixels disposed on one side of the first base substrate;

an opposite substrate, disposed opposite to the array substrate; wherein the opposite substrate comprises: a second base substrate, and a light shielding layer disposed on one side, facing the array substrate, of the second base substrate; wherein the light shielding layer comprises: a first light shielding part, a second light shielding part and a plurality of sub-pixel opening regions; an orthographic projection of a region enclosed by the first light shielding part on the second base substrate coincides with the display region, and an orthographic projection of the first light shielding part on the first base substrate covers an orthographic projection of at least part of the plurality of first pixels on the first base substrate; wherein the second light shielding part is located between adjacent sub-pixel opening regions; and the plurality of sub-pixel opening regions comprise: a plurality of first sub-pixel opening regions and a plurality of second sub-pixel opening regions; and a liquid crystal layer, disposed between the array substrate and the opposite substrate.

6. The display panel according to claim 1, wherein the at least one non-display region comprises: a second non-display region enclosed by the display region;

a shape of the second non-display region is circular; and the curve part comprises a circumference corresponding to the boundary between the second non-display region and the display region.

7. The display panel according to claim 1, wherein the at least one non-display region comprises: a first non-display region surrounding the display region;

a shape of the display region is a rounded rectangle; and the curve part comprises: four rounded corner parts of the boundary between the display region and the first non-display region.

8. The display panel according to claim 7, wherein the boundary between the first non-display region and the display region further comprises a first straight line part parallel to the second direction, and two ends of the first straight line part are connected with a rounded corner parts respectively; a radian of each of the rounded corner parts is less than or equal to 90° and larger than 60°;

each of the rounded corner parts is divided into a first part and a second part; a radian of the first part is 60°; and the second part is connected with the first straight line part; and at least one first sub-pixel opening region in each of the plurality of first pixels is adjacent to the second part.

9. The display panel according to claim 1, wherein a width of each of the plurality of sub-pixels in the first direction is less than a width of each of the plurality of sub-pixels in the second direction.

10. The display panel according to claim 1, wherein the plurality of pixels further comprise: a plurality of third pixels adjacent to the curve part in a region other than the first pixels;

each of the plurality of third pixels comprises at least one third opening region disposed in the display region, the at least one third opening region in each of the plurality of third pixels is adjacent to the curve part, and a shape of at least part of the at least one third opening region adjacent to the curve part is non-rectangular; and a ratio of an area of each third opening region to an area of a sub-pixel corresponding to the each third opening region in the display region is equal to a ratio of an area of the second opening region to an area of the sub-pixel in the second pixel.

11. The display panel according to claim 1, wherein a sub-pixel in each of the plurality of first pixels only correspond to one first sub-pixel opening region.

12. The display panel according to claim 1, wherein at least part of sub-pixels in each of the plurality of first pixels corresponds to a plurality of first sub-pixel opening regions.

13. The display panel according to claim 12, wherein the plurality of first sub-pixel opening regions are arranged in the first direction and/or the second direction.

14. The display panel according to claim 1, wherein the ratio of the area of the each first sub-pixel opening region to the area of the sub-pixel corresponding to the each first sub-pixel opening region in the display region is a first aperture ratio; and the ratio of the area of the second sub-pixel opening region to the area of the sub-pixel in the second pixel is a second aperture ratio; and a ratio of the first aperture ratio to the second aperture ratio is larger than or equal to 16.8% and less than or equal to 31.6%.

15. A display apparatus, comprising the display panel according to claim 1.

* * * * *